United States Patent
Engstrom et al.

(10) Patent No.: US 7,725,102 B2
(45) Date of Patent: May 25, 2010

(54) METHOD AND APPARATUS FOR ASSOCIATING A RECEIVED COMMAND WITH A CONTROL FOR PERFORMING ACTIONS WITH A MOBILE TELECOMMUNICATION DEVICE

(75) Inventors: Eric G. Engstrom, Kirkland, WA (US); Tyrol R. Graham, Seattle, WA (US); Peter Zatloukal, Duvall, WA (US)

(73) Assignee: Varia Holdings LLC, Brooklyn, NY (US)

( * ) Notice: Subject to any disclaimer, the term of this patent is extended or adjusted under 35 U.S.C. 154(b) by 0 days.

(21) Appl. No.: 10/477,047

(22) PCT Filed: May 10, 2002

(86) PCT No.: PCT/US02/14912

§ 371 (c)(1),
(2), (4) Date: Nov. 7, 2003

(87) PCT Pub. No.: WO02/093875

PCT Pub. Date: Nov. 21, 2002

(65) Prior Publication Data

US 2004/0171376 A1    Sep. 2, 2004

Related U.S. Application Data

(60) Provisional application No. 60/290,592, filed on May 11, 2001.

(51) Int. Cl.
*H04M 3/00* (2006.01)
*H04M 1/725* (2006.01)

(52) U.S. Cl. .................. 455/418; 455/419; 455/420; 455/412.1

(58) Field of Classification Search .............. 455/419, 455/420, 426, 466, 3.05, 3.06, 445, 410, 455/411, 418, 412.1, 412.2, 413; 709/219; 725/62
See application file for complete search history.

(56) References Cited

U.S. PATENT DOCUMENTS

| | | | | |
|---|---|---|---|---|
| 6,097,441 A * | 8/2000 | Allport | .................. | 348/552 |
| 6,151,485 A * | 11/2000 | Crisp | .................. | 455/575.4 |
| 6,333,973 B1 * | 12/2001 | Smith et al. | .............. | 379/88.12 |
| 6,591,116 B1 * | 7/2003 | Laurila et al. | ............... | 455/558 |
| 6,832,102 B2 * | 12/2004 | I'Anson | ................... | 455/556.1 |
| 6,947,396 B1 * | 9/2005 | Salmi | ......................... | 370/310 |
| 7,099,700 B2 * | 8/2006 | Hwang et al. | ............... | 455/566 |
| 7,146,578 B2 * | 12/2006 | Kim | ........................... | 715/866 |

\* cited by examiner

*Primary Examiner*—Eugene Yun
(74) *Attorney, Agent, or Firm*—Schwabe, Williamson & Wyatt P.C.

(57) ABSTRACT

The invention is directed to associating a received command with a control such as a push button on a mobile telecommunication device, and enabling an action associated with the command to be performed when the control is later activated. The command may be received from another mobile device or remote computer. The actions that may be associated with the performance instruction include tuning to a broadcast such as a radio or television, browsing a web site or hyperlinked text, and tuning to a streamed broadcast over a network, such as the Internet. The command button can be a physical element such as the "*" key on a keypad or a virtual button on a display.

30 Claims, 10 Drawing Sheets

METHOD AND APPARATUS FOR ASSOCIATING A RECEIVED COMMAND WITH A CONTROL FOR PERFORMING ACTIONS WITH A MOBILE TELECOMMUNICATION DEVICE

RELATED APPLICATION

This utility application is related to a previously filed U.S. Provisional Application Ser. No. 60/290,592, filed on May 11, 2001, the benefit of the earlier filing date of which is hereby claimed under 35 U.S.C. § 119 (e).

FIELD OF THE INVENTION

The present invention is related to mobile telecommunication devices, and more specifically to associating a received command that can include information with a control for performing actions with a mobile telecommunication device.

BACKGROUND OF THE INVENTION

Since their introduction, the number of services and features for cellular telephones has steadily increased. At first, these mobile devices operated on analog wireless networks that enabled voice communication and simple paging features. Later, digital wireless networks for cellular telephones were implemented to provide more advanced features for voice and data communication, such as encryption, caller identification and short message service (SMS) text messages. More recently, some cellular telephones enable the browsing of web pages on the Internet or other on-line services. The functionality of cellular telephones has continued to increase and incorporate many of the features originally provided for in handheld electronic devices such as personal digital assistants (PDAs). Relatively simple PDA features such as keeping a list of contacts, a calendar, appointments, and the like have been generally integrated into recent cellular telephone models.

With the increased services and features has come increased cellular phone use that enables users to stay in relatively close contact with friends and acquaintances. Users can talk about what station they are listening to on the radio or watching on television, web sites that they have browsed and games that they enjoy. In the past, there has not been an easy to use mechanism for a user to share this type of information in a way that enabled others to quickly and easily participate in the same activities.

SUMMARY OF THE INVENTION

The invention is directed to a method and apparatus for associating a command with a control on a mobile device that enables telecommunication. The command is received in a message and the command can include data for enabling an action with the mobile device. The command is automatically associated with the control; and the data is employed to automatically enable the action with the mobile device. The activation of the control causes the action to be performed with the mobile device.

Another embodiment of the invention is directed to including the command in a Short Message Service (SMS) message that is received by the mobile device. Also, the action can include at least one of tuning to a radio station, completing a telephone call, enabling a game, playing an audio recording, playing a video, displaying a picture, playing an animation, enabling a screensaver and browsing to a web site. Further, the action can be sending a channel selection to a television set or tuning to an AM or FM radio station.

In yet another embodiment, the command can be received from at least a selected one of a radio station, satellite, wireless network, pager, television station and web site. The command can be received from another mobile device that enables telecommunication and a remote computing device.

In still another embodiment, another command is received that includes other data for enabling another action with the mobile device. The other command is automatically associated with the control; and the other data is employed to automatically enable the other action with the mobile device. The activation of the control causes the other action to be performed with the mobile device.

In a further embodiment, the control can be activated by a single motion. Also, the mobile device can provide an acknowledgement when the control is activated, such as a sound, visual display and haptic feedback. The acknowledgement can include selective illumination of light sources in the mobile device; and the light sources can display a pattern. Also, another command can be associated with the control. When another activation of the control occurs, another action that corresponds to the other command can be performed.

In another embodiment, a list of other users is provided and each user in the list is linked by a relationship to the user of the mobile device. A separate list can be provided to each type of relationship to the user of the mobile device. When the list is enabled, the command can be sent to each user included in the list, wherein the command is receivable by each mobile device associated with each user included in the list.

These and various other features, as well as advantages, which characterize the present invention, will be apparent from a reading of the following detailed description and a review of the associated drawings.

DETAILED DESCRIPTION OF THE PREFERRED EMBODIMENT

Figure 1:
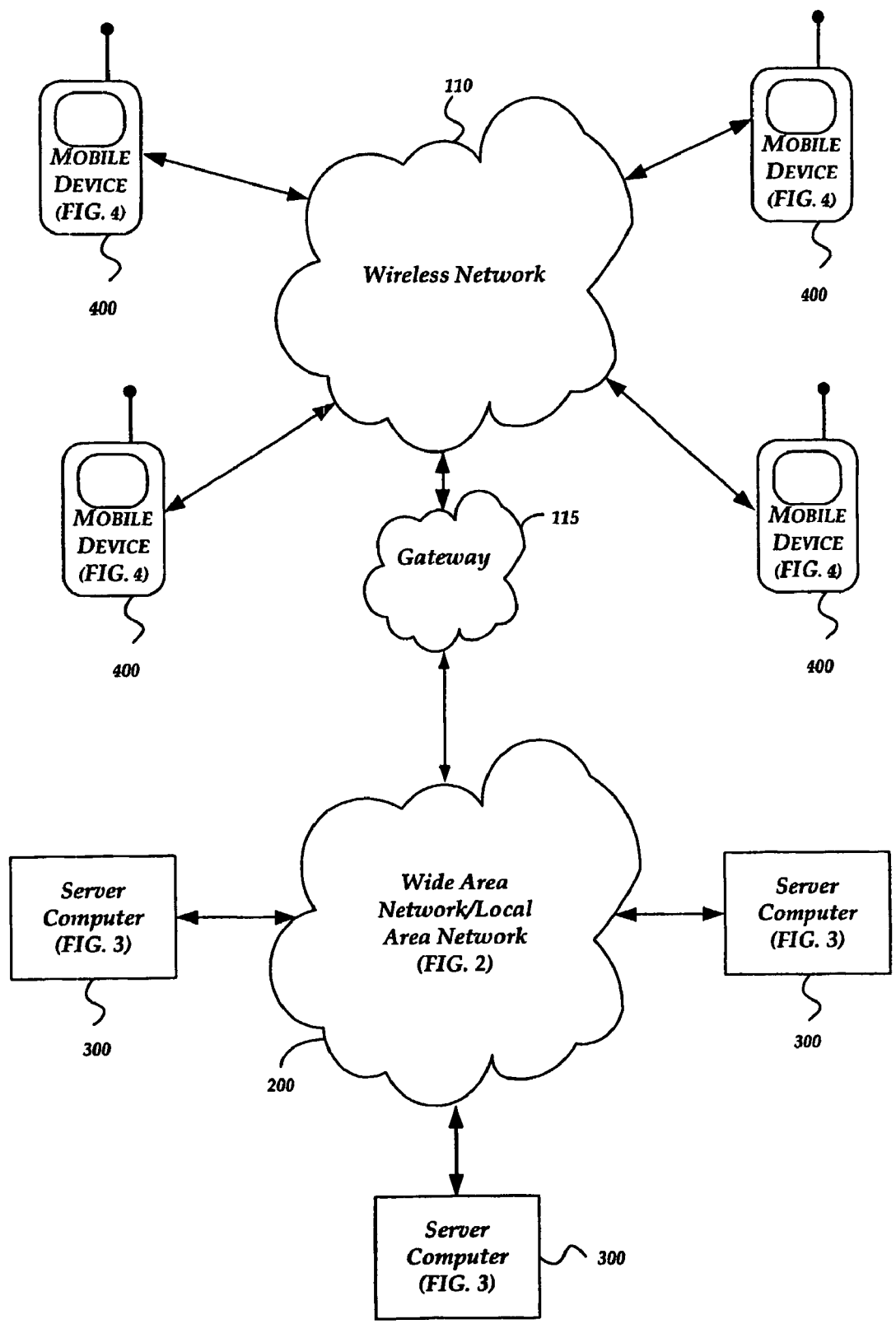
FIG. 1 is a schematic diagram that shows an exemplary system overview.

In the following detailed description of exemplary embodiments of the invention, reference is made to the accompanying drawings, which form a part hereof, and which show, by way of illustration, specific exemplary embodiments by which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "control" means any physical device on a mobile telecommunication device that when actuated causes an action to be performed or causes an operating system to switch to another program or operation in conjunction with the practice of the invention disclosed herein. Unless otherwise specified, a control is a physical component on the mobile telecommunication device. For example, a key (button) on a keypad, rotary switch, slide switch, push button, touch pad, touch sensitive display, voice activated controller, and the like. The control can be dedicated to operating solely with each received command, or it can be a multi-purpose control having other functionality assigned to it in conjunction with the practice of the invention described herein.

A "command" is employed to associate an action with the control. Also, the command includes data to be used when performing the action. For example, the action could be tuning a radio receiver to a radio station and the data could be the particular radio frequency. The "command" may be included in a message received by a mobile telecommunication device such as an SMS (Short Messaging Service) message or some other type of messaging service.

Also, the meaning of "a", "an," and "the" include plural references. The meaning of "in" includes "in" and "on." Referring to the drawings, like numbers indicate like parts throughout the views. Additionally, a reference to the singular includes a reference to the plural unless otherwise stated or inconsistent with the disclosure herein.

Briefly described, when a message that includes a command is received by a mobile telecommunication device, automatically this command is associated with a control (physical device) on the device such as a push button. Any data associated with the command is also employed to enable the device to operate in a particular manner when the control is subsequently activated by a user. For example, when a received command is "call Dave," the mobile telecommunication device would automatically configure a control to cause the completion of a telephone call to Dave upon activation. Subsequently, when the control is activated, the mobile telecommunication device would automatically dial Dave's telephone number.

Illustrative Operating Environment

With reference to FIG. 1, an exemplary system in which the invention operates includes mobile (wireless) devices 400, wireless network 110, gateway 115, wide area network (WAN)/local area network (LAN) 200 and one or more server computers 300.

Figure 4:
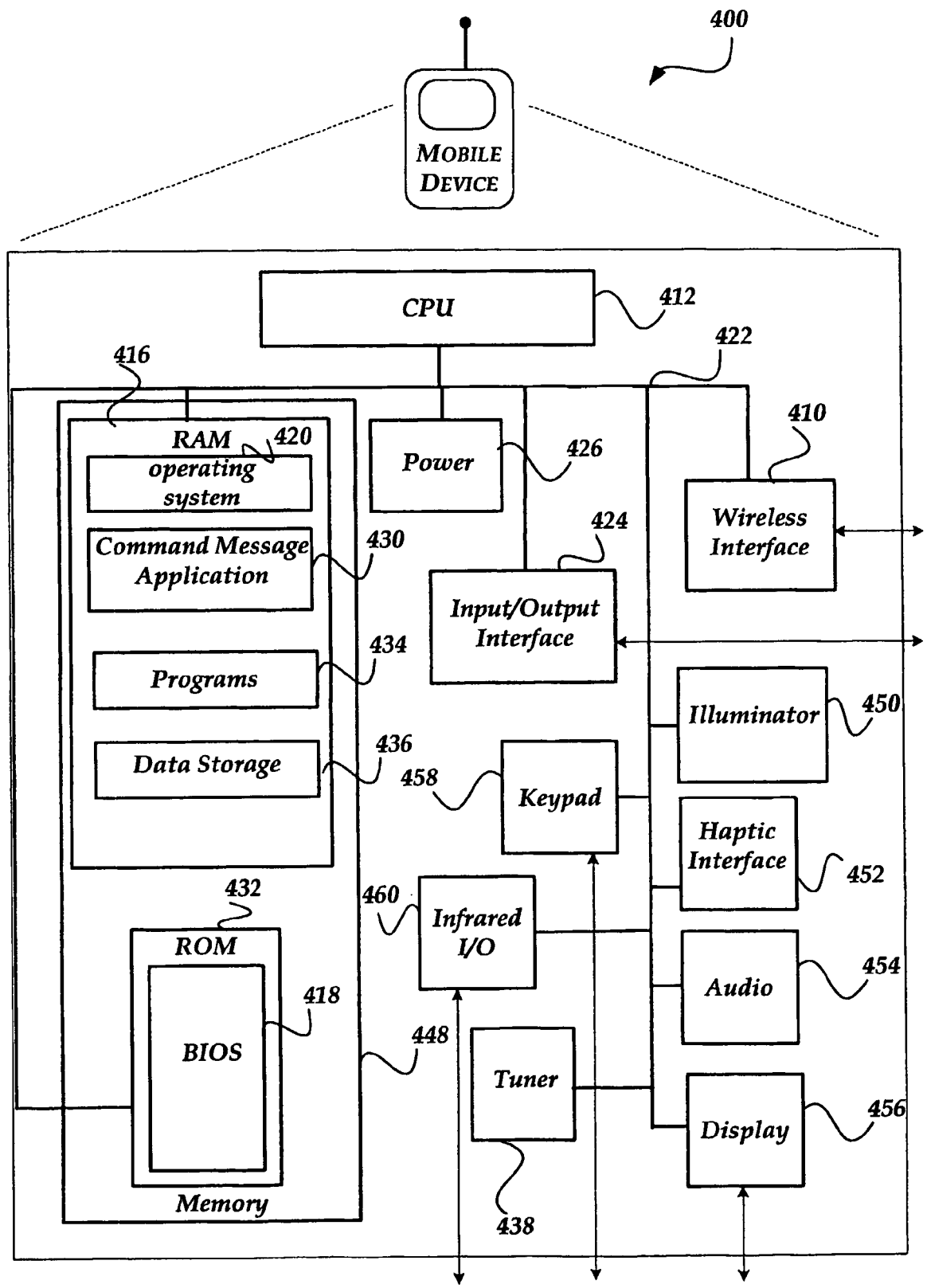
FIG. 4 is a schematic diagram that illustrates an exemplary mobile device.
Figure 5:
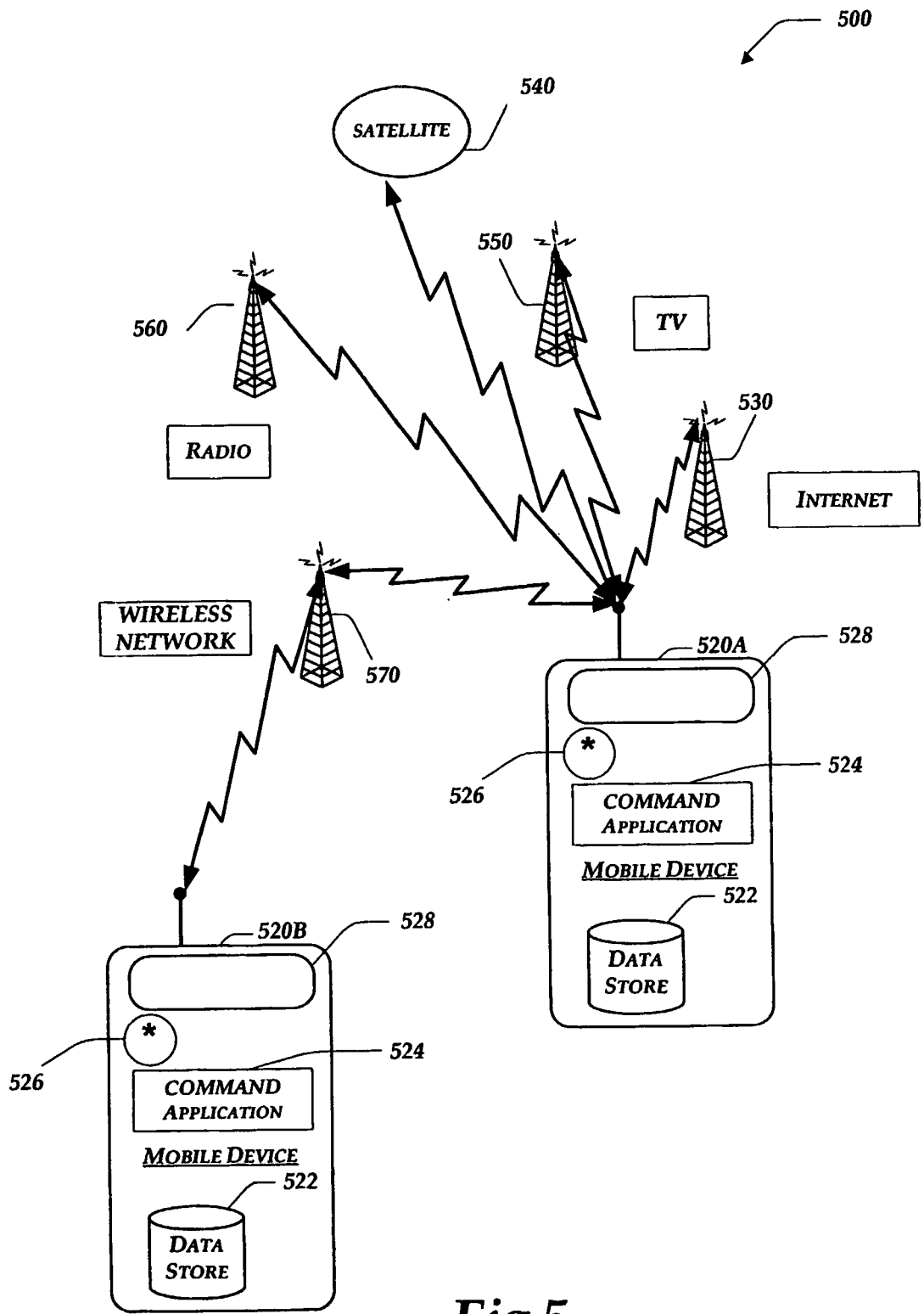
FIG. 5 is a schematic diagram that shows an exemplary system overview in which a mobile device is in communication with different types of sources.

Mobile devices 400 are coupled to wireless network 110 and are described in more detail in conjunction with FIG. 4 and FIG. 5. Generally, mobile devices 400 include any device capable of connecting to a wireless network such as wireless network 110. Such mobile devices include cellular telephones, smart phones, pagers, radio frequency (RF) devices, infrared (IR) devices, citizen band radios (CBs), integrated devices combining one or more of the preceding devices, and the like. Mobile devices 400 may also include other devices that have a wireless interface such as PDAs, handheld computers, personal computers, multiprocessor systems, microprocessor-based or programmable consumer electronics, network PCs, wearable computers, and the like.

Wireless network 110 transports information to and from mobile devices capable of wireless communication. Wireless network 110 may include both wireless and wired components. For example, wireless network 110 may include wireless cellular sites (not shown) that are coupled to another wired telephone network. Typically, a cellular site carries communication to and from cellular telephones, pagers, and other mobile devices; and the wired telephone network carries communication to landline telephones, long-distance communication links, and the like.

Wireless network 110 is coupled to WAN/LAN through gateway 115. Gateway 115 routes information between wireless network 110 and WAN/LAN 200. For example, a user using a mobile device may browse the Internet by calling a certain number or tuning to a particular frequency. Upon receipt of the number, wireless network 110 is configured to pass information between the wireless device and gateway 115. Gateway 115 translates requests for web pages from mobile devices into hypertext transfer protocol (HTTP) messages, which may then be sent to resources coupled to WAN/LAN 200. Gateway 115 may also translate responses to such messages into a protocol compatible with the requesting mobile device. Additionally, Gateway 115 may be used to translate exchanges of other types of messages, e.g., SMS (short message service) messages, between mobile devices 400 that are facilitated by resources (servers) coupled to WAN/LAN 200.

Figure 2:
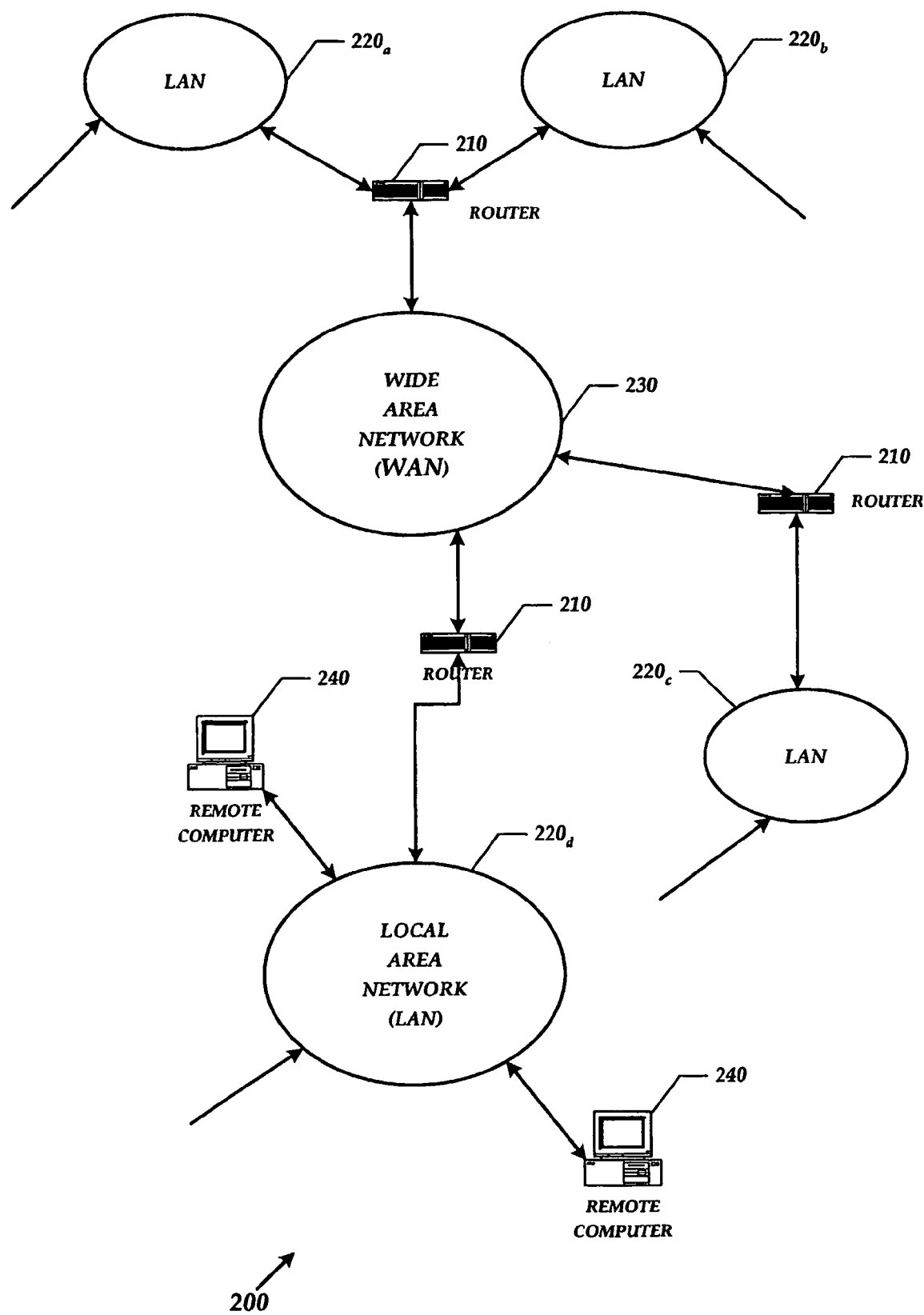
FIG. 2 is a schematic diagram that illustrates an exemplary system overview in which local area networks and a wide area network are interconnected by routers.

Typically, WAN/LAN 200 transmits information between computing devices as described in more detail in conjunction with FIG. 2. One example of a WAN is the Internet, which connects millions of computers over a host of gateways, routers, switches, hubs, and the like. An example of a LAN is a network used to connect computers in a single office. A WAN may connect multiple LANs. Server computers 300 are coupled to WAN/LAN 200 through communication mediums. Server computers 300 provide access to information and services as described in more detail in conjunction with FIG. 3.

FIG. 2 shows another exemplary system in which the invention operates in which a number of local area networks ("LANs") $220_{a-d}$ and wide area network ("WAN") 230 interconnected by routers 210. Routers 210 are intermediary devices on a communications network that expedite message delivery. On a single network linking many computers through a mesh of possible connections, a router receives transmitted messages and forwards them to their correct destinations over available routes. On an interconnected set of LANs—including those based on differing architectures and protocols—, a router acts as a link between LANs, enabling messages to be sent from one to another. Communication links within LANs typically include twisted wire pair, fiber optics, or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links, or other communications links known to those skilled in the art.

Furthermore, computers, such as remote computer 240, and other related electronic devices can be remotely connected to either LANs $220_{a-d}$ or WAN 230 via a modem and temporary telephone link. The number of WANs, LANs, and routers in FIG. 2 may be increased or decreased without departing from the spirit or scope of this invention. As such, it will be appreciated that the Internet itself may be formed from a vast number of such interconnected networks, computers, and routers and that an embodiment of the invention could be practiced over the Internet without departing from the spirit and scope of the invention.

The media used to transmit information in communication links as described above illustrates one type of computer-readable media, namely communication media. Generally, computer-readable media includes any media that can be accessed by a computing device. Computer-readable media may include computer storage media, communication media, or any combination thereof.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, communication media includes wired media such as twisted pair, coaxial cable, fiber optics, wave guides, and other wired media and wireless media such as acoustic, RF, infrared, and other wireless media.

The Internet has recently seen explosive growth by virtue of its ability to link computers located throughout the world. As the Internet has grown, so has the WWW. Generally, the WWW is the total set of interlinked hypertext documents residing on HTTP (hypertext transport protocol) servers around the world. Documents on the WWW, called pages or Web pages, are typically written in HTML (Hypertext Markup Language), or some other markup language, identified by URLs (Uniform Resource Locators) that specify the particular machine and pathname by which a file can be accessed, and transmitted from server to end user using HTTP. Codes, called tags, embedded in an HTML document associate particular words and images in the document with URLs so that a user can access another file, which may be halfway around the world, at the press of a key or the click of a mouse. These files may contain text (in a variety of fonts and styles), graphics images, movie files, media clips, and sounds as well as Java applets, ActiveX controls, or other embedded software programs that execute when the user activates them. A user visiting a Web page may also be able to download files from an FTP site and send messages to other users via email by using links on the Web page.

Figure 3:
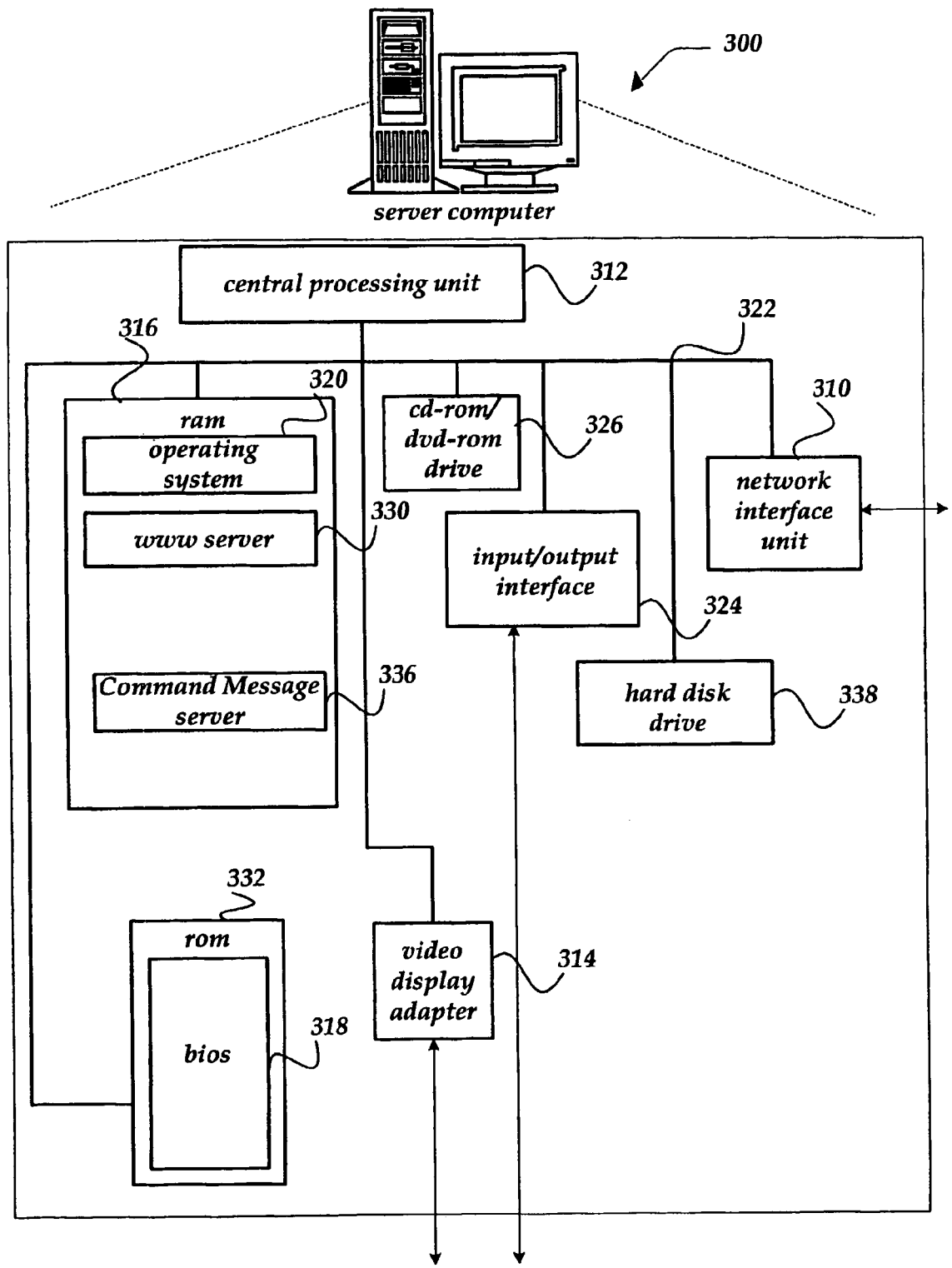
FIG. 3 is a schematic diagram that shows an exemplary server computer.

Server computer 300, as described in regard to FIG. 3, is a computer connected to a network and having storage facilities for storing hypertext documents for a WWW site, running administrative software (WWW server) for handling requests for the stored hypertext documents and enabling a facility (command message server) to handle command based messages communicated between mobile devices. The server computer 300 may include many more components than those shown in FIG. 3. However, the components shown are sufficient to disclose an illustrative embodiment for practicing the present invention.

As shown in FIG. 3 server computer 300 is connected to WAN/LAN 200, or other communications network, via network interface unit 310. Network interface unit 310 includes the circuitry for connecting WWW server 330 and command message server 336 to WAN/LAN 200, and is constructed for use with various communication protocols including TCP/IP and WAP. Typically, network interface unit 310 is a card contained within server computer 300.

Server computer 300 also includes processing unit 312, video display adapter 314, and a mass memory, all connected via bus 322. The mass memory generally includes RAM 316, ROM 332, and one or more permanent mass storage devices, such as hard disk drive 328, a tape drive, CD-ROM/DVD-ROM drive 326, and/or a floppy disk drive. The mass memory stores operating system 320 for controlling the operation of server computer 300. This component may comprise a general purpose server operating system such as UNIX, LINUX™, or Microsoft WINDOWS NT®. Basic input/output system ("BIOS") 318 is also provided for controlling the low-level operation of server computer 300.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data for providing a WWW site and managing command messages. More specifically, the mass memory stores applications including WWW server 330 and command message server 336. Generally, command message server 336 includes instructions for facilitating the communication of command based messages communicated between mobile devices. WWW server 330 includes computer executable instructions which, when executed on server computer 300, generate WWW browser displays, including performing the logic described elsewhere in the specification.

Additionally, although command messages may be sent between users of mobile devices, it is further understood that command messages may be sent to mobile devices by others that are operating remote computers and by other third party services, such as radio stations, television stations and web sites. In these cases, the command message server would operate in substantially the same manner as it would to handle command messages communicated between mobile devices.

Server computer 300 also comprises input/output interface 324 for communicating with external devices, such as a mouse, keyboard, scanner, or other input devices not shown in FIG. 3. Likewise, server computer 300 may further comprise additional mass storage facilities such as CD-ROM/DVD-ROM drive 326 and hard disk drive 328. Hard disk drive 328 is utilized by server computer 300 to store, among other things, applications, databases, and data used by WWW server 330 and command message server 336.

Command message server 336 may include a library or database of predetermined commands that are organized by categories and one or more lists of preselected users designated to receive selected images. Additionally, command message server 336 may incorporate facilities for handling command messages that are included in SMS messages and wireless protocols, such as WAP.

FIG. 4 shows an exemplary mobile device 400, according to one embodiment of the invention. In one embodiment, mobile device 400 is a cellular telephone that is arranged to send and receive messages. In particular, mobile device 400 may be arranged to send and receive SMS messages that can include data representing a command. Of course, other messaging services that can include data representing a command may also be employed with mobile device 400.

Mobile device 400 may include many more components than those shown in FIG. 4. However, the components shown are sufficient to disclose an illustrative embodiment for practicing the present invention. As shown in the figure, mobile device 400 includes processing unit 412, memory 448, RAM 416, ROM 432, operating system 420, command message application 430, programs 434, data storage 436, bios 418, power 426, input/output interface 424, wireless interface unit 410, tuner 438, illuminator 450, haptic interface 452, audio 454, display 456, keypad 458 and infrared input/output 460.

Mobile device 400 may connect to WAN/LAN 200, or other communications network, via wireless interface unit 410. Wireless interface 410 includes circuitry for connecting mobile device 400 to wireless network 110, and is constructed for use with various communication protocols including TCP/IP and WAP. Wireless interface 410 may include a radio layer (not shown) that is arranged to send and receive radio frequency communications. Typically, wireless interface 410 connects mobile device 400 to other mobile devices, via a telecommunications carrier or service provider. Also, wireless interface 410 may be arranged to communicate with other mobile devices without assistance from a carrier or service provider. For example, wireless interface 410 may support a wireless protocol such as IEEE 802.11b and the like for communicating directly with other mobile devices.

Mass memory 448 generally includes RAM 416, ROM 432, and one or more data storage units 436. The mass memory stores operating system 420 for controlling the operation of mobile device 400. It will be appreciated that this component may comprise a general purpose operating system such as a version of UNIX, LINUX™, or Microsoft WINDOWS®. Basic input/output system ("BIOS") 418 is also provided for controlling the low-level operation of mobile device 400.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores application code and data used by mobile device 400. More specifically, the mass memory stores command message application 430, and programs 434. Command message application 430 may be loaded into memory 448 and run under control of operating system 420. Also, programs 434 may include computer executable instructions which, when executed by mobile device 400, transmit and receive WWW pages, e-mail, audio, video, and enable telecommunication with another user of another mobile device.

Mobile device 400 also comprises input/output interface 424 for communicating with external devices, such as a headset, or other input or output devices not shown in FIG. 4. Data storage 436 can be utilized by mobile device 400 to store, among other things, programs 434, command message application 436, databases and/or libraries of commands, lists and other data. Keypad 458 may be any input device arranged to receive input from a user. For example, keypad 458 may include a push button numeric dial, or a keyboard. Keypad 458 may also include at least one push button that can be associated with a received command. Display 456 may be a liquid crystal display (LCD), gas plasma, light emitting diode (LED), or any other type of display used with a mobile device. Display 456 may also include a touch sensitive screen arranged to receive input from an object such as a stylus or a digit from a human hand. Additionally, infrared input/output 460 may be used to send and receive infrared commands to/from other devices.

Power supply 426 provides power to mobile device 400. A rechargeable or non-rechargeable battery may be used to provide power. The power may also be provided by an external power source, such as an AC adapter or a powered docking cradle that supplements and/or recharges a battery.

Illuminator 450 may remain active for specific periods of time or in response to events. For example, when illuminator 450 is active, it may backlight the buttons on keypad 459 and stay on while the mobile device is powered. Also, illuminator 450 may backlight these buttons in various patterns when particular actions are performed, such as receiving or sending commands. These patterns may be predetermined or random, e.g., a happy face or starburst. Illuminator 450 may also cause light sources positioned within a transparent or translucent case of the mobile device to illuminate in response to actions.

Audio interface 454 is arranged to produce and receive audio signals such as the sound of a human voice. For example, audio interface 454 may be coupled to a speaker and microphone (not shown) to enable telecommunication with others and/or generate an audio acknowledgement for some action.

Haptic interface 452 is arranged to provide sensory feedback to a user of the mobile device. For example, the haptic interface may be employed to vibrate the mobile device in a particular way when command messages are sent to other users of mobile devices; and vibrate in another way when command messages are received by the mobile device from another user.

Tuner 438 may be any type of tuner arranged to receive a broadcast. For example, tuner 438 may be an AM tuner, an FM tuner, an AM/FM tuner, an Internet radio tuner, a television tuner, a Satellite radio tuner, or the like. Tuner 438 may be a hardware component or implemented in software by a digital signal processor (not shown). A software-based tuner could employ various CODECs for tuning to different types of broadcasts.

Infrared input/output port 460 may be used by mobile device 400 to select the channel of a television set, or to input/output data with another mobile device or fixed device such as a PDA (not shown).

In various embodiments, the mobile device may be a selected one of a wireless mobile phone, a pager, a personal digital assistant (PDA), a palm-sized computing device, a laptop computer, a portable radio, a portable MPx player, and a portable CD/DVD player.

FIG. 5 shows an overview 500 of a system generally illustrating an embodiment of the invention. Each mobile device 520A and 520B includes at least command application 524, control 526, display 528 and data store 522. Mobile devices 520A and 520B may store data locally in data store 522 or remotely in another data store that is accessible over a network (not shown). Mobile devices 520A and 520B are capable of wirelessly receiving command messages sent from a plurality of sources, including radio 560, satellite 540, television 550, Internet 530 and wireless network 570. Also, a command message sent from mobile device 520B to mobile device 520A can be communicated over wireless network 570 and the like. In operation, the mobile device can receive command messages from any one of the sources and automatically configure itself to perform the command when control 526 is activated. As shown, control 526 is represented by a push button labeled with an asterisk "*".

Figure 6:
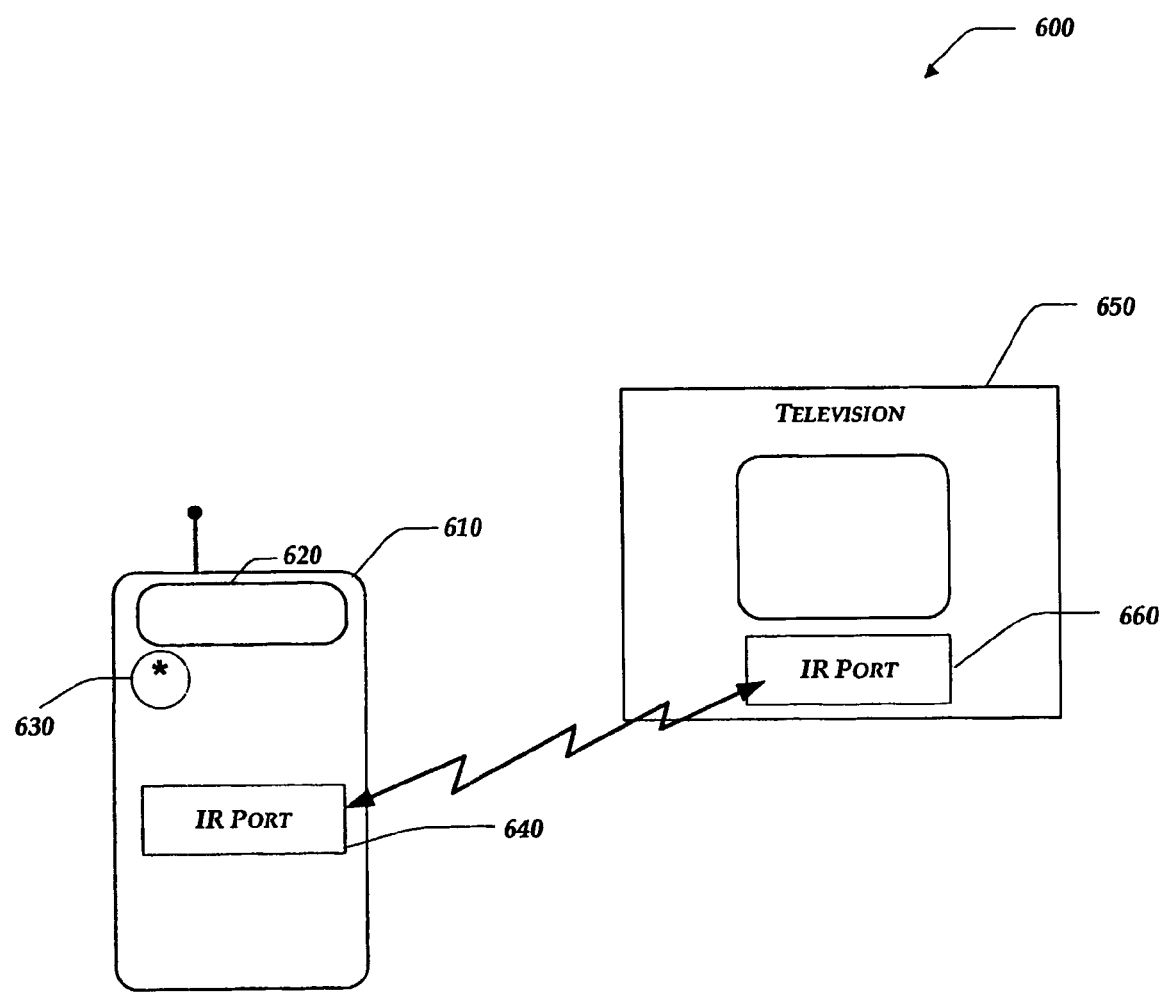
FIG. 6 is a schematic diagram that shows an exemplary system overview in which a control on a mobile device is employed to select a television channel for display on a television set.

FIG. 6 illustrates an overview 600 of mobile device 610 that includes display 620, control 630 and infrared port 640 for transmitting and receiving messages between other devices with substantially similar infrared ports. In the exemplary embodiment, television 650 includes infrared port 660 for transmitting and receiving messages between mobile device 610. In operation, the activation of control 630 causes a message (channel selection) to be transmitted from the mobile device's infrared port 640 to the television's infrared port 660. The received message causes television 650 to tune (change) to a particular television channel based on information included in the message. Additionally, other types of wireless communications such as RF (radio frequency) technology could be employed to communicate messages between mobile device 610 and television 650.

Figure 7:
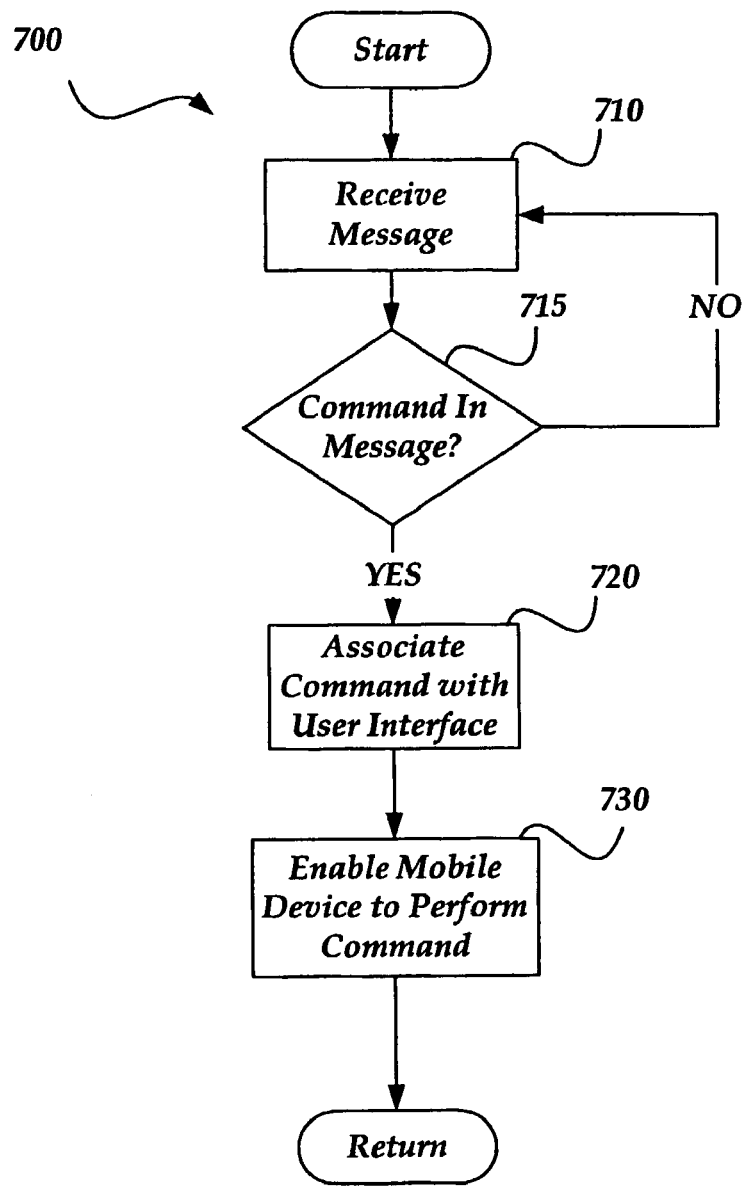
FIG. 7 is a flow chart that illustrates a process for receiving and implementing a command associated with a control on the mobile device.

FIG. 7 shows an overview 700 of a process for receiving command messages with a mobile device. Moving from a start block, the process advances to block 710 where a message is received. The process moves to decision block 715 where a determination is made as to whether the message includes a command. If false, the process loops back to block 710 and returns to performing substantially the same actions discussed above. Alternatively, when the determination at decision block 715 is affirmative, the process moves to block 720 where the command is associated with a control of the mobile device such as a switch, push button and the like. Advancing to block 730, the process automatically configures the operation of the mobile device in accordance with the command included with the received message. Also, any data associated with the command and included with the message can be employed to configure the operation of the mobile device.

In one embodiment (not shown), the message need not explicitly include a particular type of command. Instead, the data included in a message could cause the association of an implicit type of command with a control and the automatic configuration of a particular operation of the mobile device. The command could be implied based upon context or a protocol. For example, when a mobile device only accepted commands to dial, the telephone number (data) would only need to be included in the message. A received message that included a telephone number could cause a control to be automatically configured so that, upon activation, the mobile device dialed the received telephone number. Also, the received message could include some generic indication that a command is associated with the data; and where the command could be inferred by determining the type of data included in the message.

Advancing to decision block 740, a determination is made as to whether the control is activated. If not, the process moves to another decision block 760 where another determination is made as to whether a new command is received. If true, the process jumps back to block 720 and performs substantially the same actions discussed above. However, when the determination at decision block 760 is false, the process loops back to decision block 740 and repeats substantially the same actions discussed above.

When the determination at decision block 740 is affirmative, i.e., the control is activated, the process moves to a block 750 where the command is performed with the mobile device. Next the process loops back to decision block 760 and resumes performing substantially the same actions discussed above.

Any type of protocol may be used to communicate messages that (explicitly and/or implicitly) include commands for associating with a control in a mobile device such as the Short message Service (SMS) protocol and the like.

The SMS protocol enables short text and data messages to be sent and received over a wireless network between mobile devices such as cellular telephones, pagers and the like. The SMS protocol can be used on a variety of cellular networks, including Global System for Mobile Communications (GSM) cellular telephone networks. Generally, there are three types of SMS messages: GSM character set-encoded messages (effectively 7-bit encoded text), UCS2-encoded messages (Unicode encoded 16-bit text), and 8-bit binary-encoded messages. Typically, GSM-encoded messages and UCS2-encoded messages are textual and are displayed to the user by a messaging application as soon as they are received, whereas 8-bit binary-encoded messages are often directed at providing device-specific information, such as device configuration messages.

SMS messages have a "User Data Header" which can contain additional information, such as source and destination port numbers (similar to TCP/IP), concatenation information (to support multi-part SMS messages), and the like. The User Data Header allows an SMS message to be customized, i.e., a command and its associated data could be included in a customized header of an SMS message. Special characters or strings could be used in SMS messages to denote messages that include commands and/or associated data. For example, an SMS message containing the string "!LI!" might indicate that a command is included with the message. Typically, the special string "!LI!" would not be displayed directly to the user.

Additional information could be placed in the string by using a numerical designator to indicate the type of command. For example, adding the number "1" to the string could indicate that the mobile device should configure a control to browse a hypertext link when activated. Similarly, the number "2" could represent a command for tuning to a radio frequency and the number "3" could represent another command for tuning to a television station. Thus, the presence of a hypertext link command in a message could be disclosed by the string "!LI!1". Additionally, the data associated with the command could precede the string in the header and/or be included in the body of the message.

As discussed above, the command is employed to specify an activity (such as tune a radio included with the mobile device) that is enabled for activation by a control on the mobile device, and the associated data designates how to perform the activity (e.g., the actual radio frequency that a tuner will tune to). In some cases, the command could be implied based upon context or a protocol.

Figure 8:
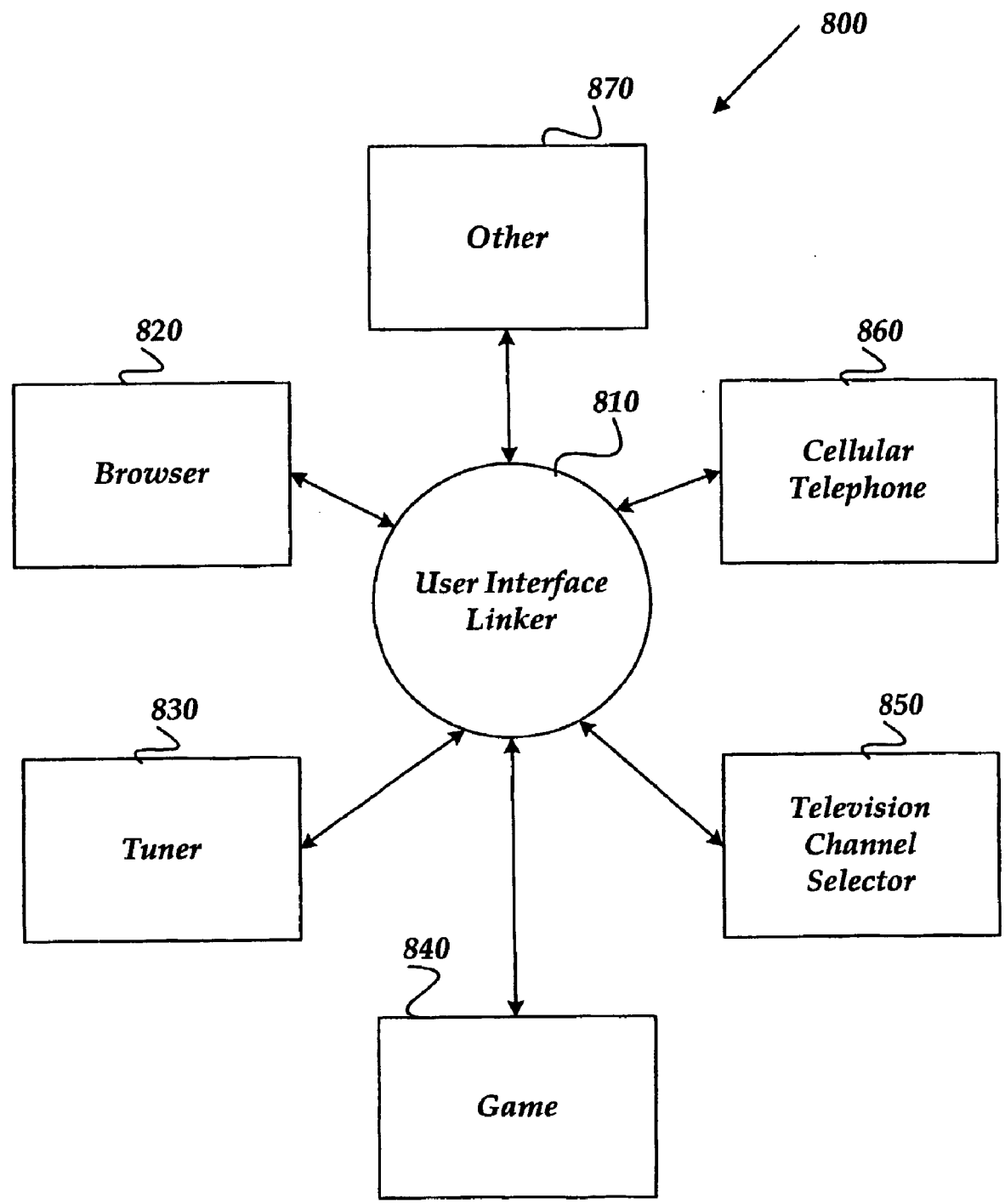
FIG. 8 is a flow chart that shows a process for receiving a message that includes a command and data.

FIG. 8 illustrates an overview 800 of components that may be employed by one embodiment of a command message application residing on a mobile device. When the command message application receives a command, it automatically employs control linker 810 to associate the command with a control on the mobile device. Additionally, control linker 810 determines which component is suited to perform the action indicated by the command and automatically links this determined component to the control. Also, any data associated with the command is provided to the linked component. Thus, when the control is activated, the linked component will automatically perform the action indicated by the command in accordance with any data that might have been associated with the command.

Control linker 810 is in communication with several components including, but not limited to, cellular telephone 860, browser 820, tuner 830, game 840 and television channel selector 850. For example, when a received command indicates browsing and includes data that identifies a particular web site, control linker 810 automatically passes the data to browser 820 and links the activation of the control to the browser. Upon activation of the control, browser 820 will automatically cause the mobile device to browse to the particular web site identified by the data. Additionally, based on the received command and data, the command message application will perform substantially the same actions in substantially the same manner with the other components.

Figure 9:
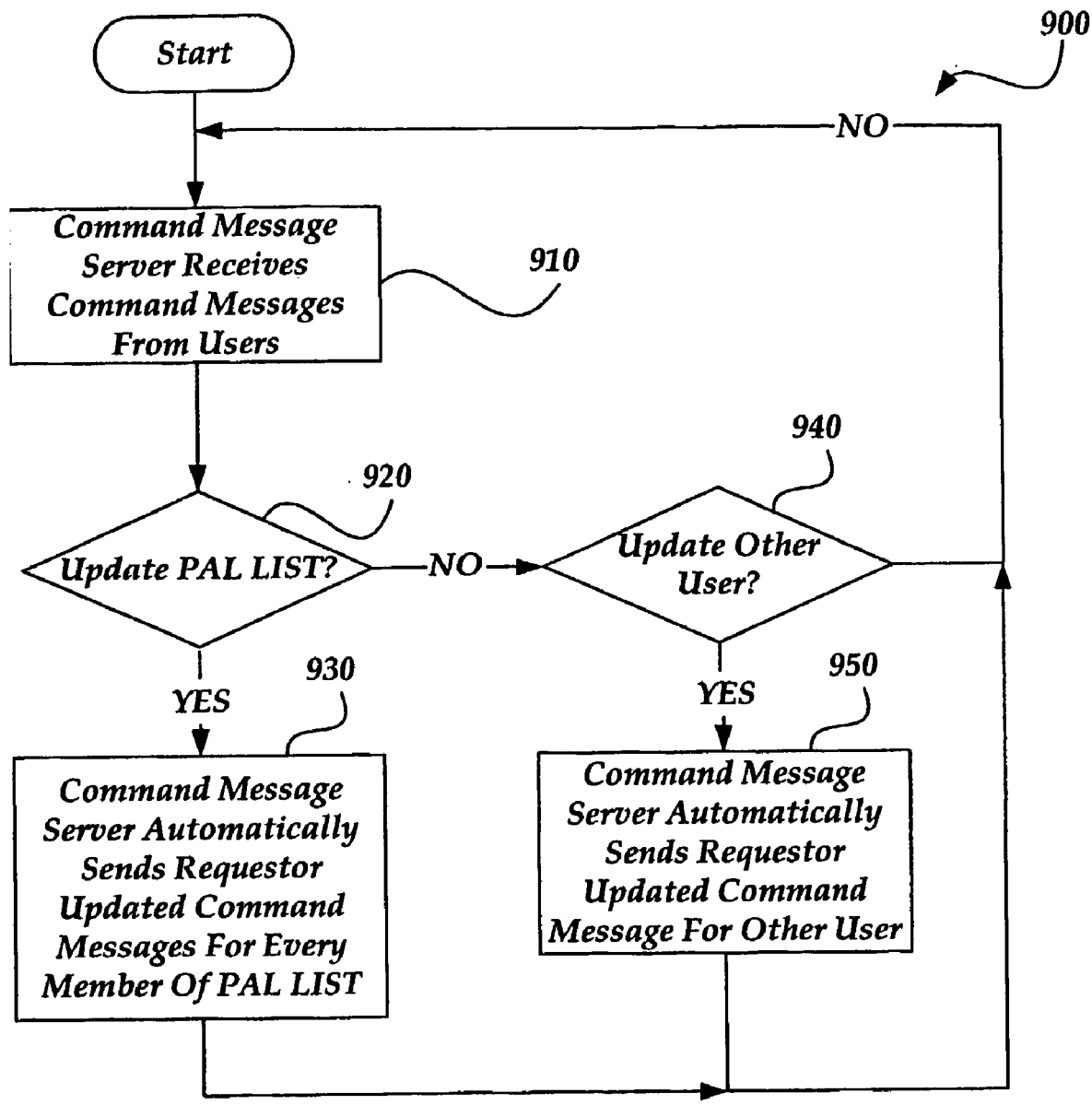
FIG. 9 is a functional block diagram showing one embodiment for a command message application.

FIG. 9 illustrates a flow chart 900 for requesting updated command messages and, in response, automatically receiving updated commands. After a start block, the process advances to block 910, where each command message sent by a user of a mobile device to at least one other user is received and stored by a command message server, such as discussed above in regard to FIG. 3. Also, the command message server keeps a copy of the PAL LIST(s) for each user. Further, when a user of a mobile device sends a command message, the user's display of his current command message is automatically updated. The process moves to decision block 920 where a determination is made if the user has requested updated command messages From each member of a PAL LIST. If affirmative, the process advances to block 930 where the command message server automatically sends a reply to the user that includes the current command message for each member of the PAL LIST. Next, the process jumps to block 910 and performs substantially the same actions as discussed above.

Alternatively, when the determination at decision block 920 is negative, the process moves to decision block 940 where a determination is made whether a user has requested an updated command message for another user. If affirmative, the process moves to block 950 where the command message server automatically sends a reply to the user that includes the current command message for the other user. Next, the process jumps to block 910 and returns to performing substantially the same actions as discussed above.

Figure 10:
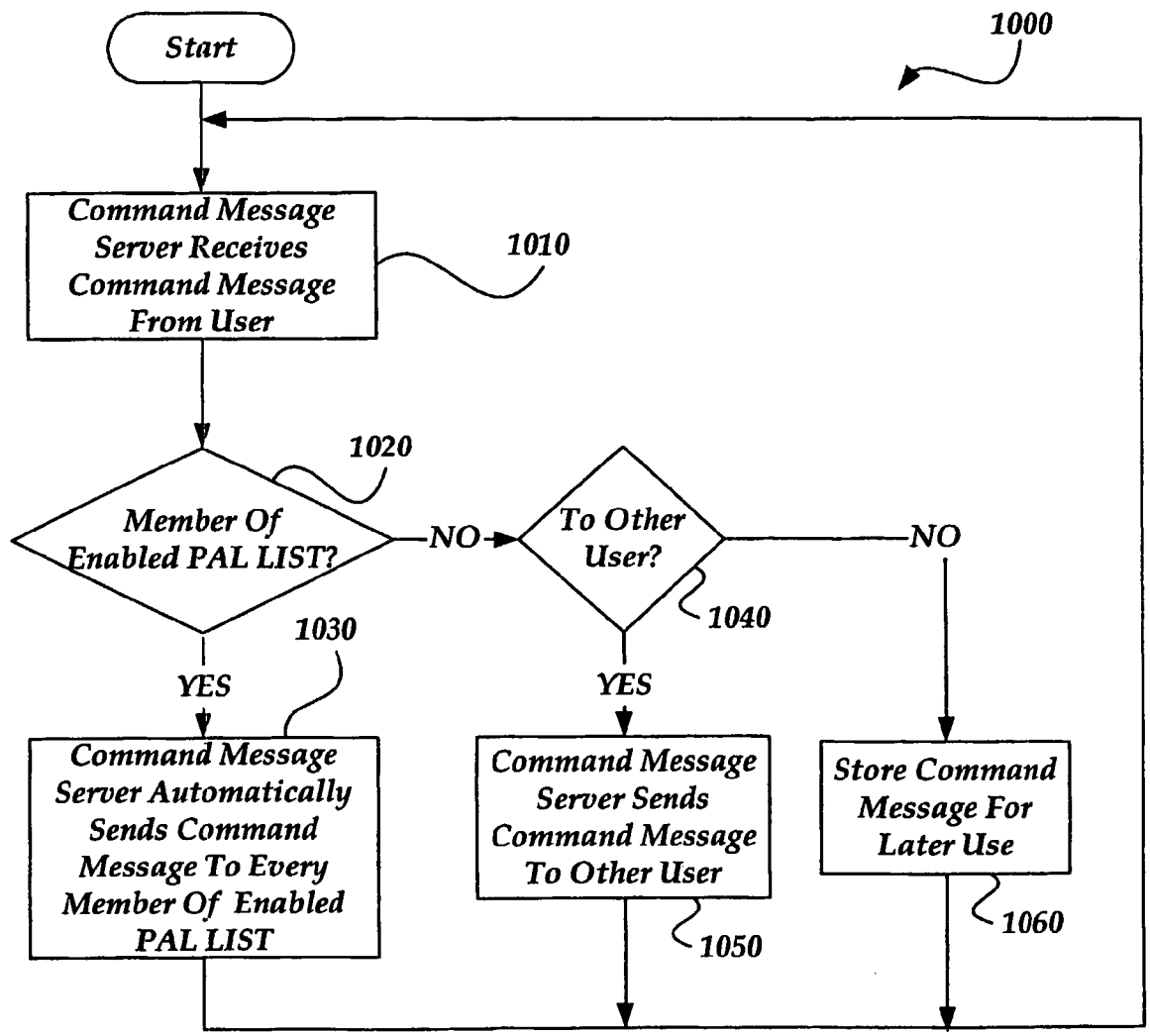
FIG. 10 is a flow chart showing a process for polling for command messages from at least one other member of a list.

FIG. 10 illustrates a flow chart 1000 for receiving and forwarding command messages. Moving from a start block, the process advances to block 1010 where a command message server receives a command message sent by a user of a mobile device. The process flows to decision block 1020 where a determination is made as to whether the user has sent a command message to another user of another mobile device and which is also a member of an enabled PAL LIST associated with the user. A member of a PAL LIST can selectively enable the automatic sending of each new command message sent by at least one member to every other member. If affirmative, the process moves to block 1030 where the command message server broadcasts (sends) the command message to each member of the enabled PAL LIST associated with the user of the mobile device. Next, the process jumps to block 1010 and performs substantially the same actions discussed above.

Alternatively, when the determination at decision block 1020 is negative, the process advances to decision block 1040 where the command message server determines if the command message is sent to another user of a mobile device. If affirmative, the process moves to block 1050 where the command message server automatically forwards the command message to the other user. Next, the process returns to block 1010 and performs substantially the same actions as discussed above.

Additionally, when the determination at decision block 1040 is negative, the process flows to block 1060 and stores the command message for later forwarding by the command message server in response to a request for the current message associated with the user. Next, the process returns to block 1010 and performs substantially the same actions as discussed above.

In various alternate embodiments, the invention may also be practiced with a potential command sender first sending a query to a potential command recipient mobile device, inquiring into one or more relevant capabilities of the mobile device. The command is sent only upon receiving from the potential recipient mobile device, a favorable reply to the capability query. The generation and sending of the query, as well as the receive and interpretation of the reply may be performed using the same elements earlier described for generating the message with a command and the relevant enabling and association data.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method comprising:
 (a) providing, by a mobile device, a capability description of the mobile device to a command sender, responsive to a query from the command sender inquiring as to capabilities of the mobile device;
 (b) receiving, by the mobile device, from the command sender, a message comprising a command, which includes data for enabling an action on the mobile device to tune to a radio station, or locally play an audio recording, wherein the radio station and the command sender are different entities;
 (c) automatically associating, by the mobile device, the command with a key of the mobile device;
 (d) employing, by the mobile device, the data to automatically enable the action on the mobile device;
 (e) when the key is activated, causing, by the mobile device, the action to be performed; and
 (f) sending, by the mobile device, the command to one or more mobile devices associated with one or more users included in an enabled list stored on the mobile device.

2. The method of claim 1, wherein the message that includes the command is a Short Message Service (SMS) message.

3. The method of claim 1, wherein the action comprises the mobile device sending a channel selection to a television set.

4. The method of claim 1, wherein the command sender is a web site.

5. The method of claim 1, wherein the command sender is another mobile device.

6. The method of claim 1, further comprising:
(a) receiving another message comprising another command, the other command also including other data for enabling another action on the mobile device, wherein the another action includes at least a selected one from the group consisting of locally playing a game, locally playing an audio recording, locally playing a video, and locally playing an animation;
(b) automatically associating the other command with a key of the mobile device;
(c) employing the other data to automatically enable the other action on the mobile device; and
(d) when the key with which the another command is associated is activated, causing the another action to be performed on the mobile device.

7. The method of claim 1, further comprising acknowledging the activation of the key.

8. The method of claim 7, wherein the acknowledgement includes at least one selected from the group consisting of a sound, visual display and haptic feedback.

9. The method of claim 7, wherein the acknowledgement comprises selectively illuminating light sources of the mobile device.

10. The method of claim 9, wherein the selective illumination comprises displaying a pattern with the illuminated light sources.

11. The method of claim 1, wherein the enabled list of one or more users is one of a plurality of lists of users.

12. The method of claim 11, wherein each of the plurality of lists corresponds to a type of relationship of each user in the lists to the user of the mobile device.

13. The method of claim 1, wherein the sending comprises generating another message by the mobile device comprising the command and the data, to enable the action on another mobile device, to associate the other command with a key of the other mobile device, such that when the key of the other mobile device is activated, the action will be performed on the other mobile device; and
sending by the mobile device the other message to the other mobile device.

14. The method of claim 13, wherein the method further comprises prior to performing the generating and sending of the other message,
sending by the mobile device, a query to the other mobile device inquiring into one or more relevant capabilities;
receiving by the mobile device, a reply from the other mobile device to the query; and
determining whether the reply is favorable for the sending of the other message, by the mobile device, to the other mobile device.

15. An apparatus comprising:
(a) a transceiver for
(i) providing a capability description of the apparatus to a command sender, responsive to a query from the command sender inquiring as to capabilities of the apparatus;
(ii) receiving a message comprising a command which includes data for enabling an action on the apparatus to tune a broadcast of a broadcaster, or locally play an audio recording, wherein the broadcaster and the command sender are different entities;
(iii) sending the command to one or more mobile devices associated with one or more users included in an enabled list stored on the apparatus;
(b) an associator coupled to the transceiver to automatically associate the command with a key;
(c) a linker coupled to the transceiver to employ the included data to automatically enable the action on the apparatus; and
(d) a transcoder coupled to the key to cause the action to be performed on the mobile device when the key is activated.

16. The apparatus of claim 15, further comprising a display equipped to display at least one selected from the group consisting of text, graphic, video and picture.

17. The apparatus of claim 16, wherein the display include a selected one from the group consisting of liquid crystal display (LCD), light emitting diode (LED), organic LED, fluorescent, incandescent, and plasma.

18. The apparatus of claim 15, wherein the message is an SMS message.

19. The apparatus of claim 15, wherein the action comprises sending a television channel selection to a television set.

20. The apparatus of claim 15, wherein the broadcast includes a selected one of radio, television, audio, video, and data.

21. The apparatus of claim 15, wherein the broadcast comprises an RF broadcast of a radio station, the radio station being broadcast on a selected one of AM and FM frequencies.

22. The apparatus of claim 15, further comprising a haptic feedback device to provide haptic feedback when the physical key is activated.

23. The apparatus of claim 15, wherein the command sender is another mobile device.

24. The apparatus of claim 15, wherein the command sender is a remote computing device.

25. The apparatus of claim 15, wherein the apparatus is a selected one from the group consisting of a wireless mobile phone, a pager, a personal digital assistant (PDA), a palm-sized computing device, a laptop computer, a portable radio, a portable MPx player, and a portable CD/DVD player.

26. The apparatus of claim 15, wherein for performing said sending, said transcoder and transceiver are further employed to
generate another message comprising the command and the data, to enable the action on another mobile device, to associate the other command with a key of the another mobile device, such that when the key of the other mobile device is activated, the other action will be performed on the other mobile device; and
send the other message from the apparatus to the other mobile device.

27. The apparatus of claim 26, wherein prior to performing said generating and sending, said transcoder and transceiver are further employed to
send a query from the apparatus to the other mobile device inquiring into one or more relevant capabilities,
receive for the apparatus a reply from the other mobile device to the query; and
determine for the apparatus whether the reply is favorable for the sending of the other message.

28. A mobile device comprising:
(a) means for receiving a message from a command sender comprising a command that includes data for enabling an action on the mobile device unassociated with the command sender;
(b) means for automatically associating the command with a key of the mobile device;
(c) means for employing the data to automatically enable the action on the mobile device;

(d) means for causing the action to be performed on the mobile device when the key is activated; and (e) means for sending the command to one or more mobile devices associated with one or more users included in an enabled list stored on the mobile device.

29. The mobile device of claim 28, wherein the message is an SMS message.

30. The method of claim 28, wherein the action includes at least a selected one from the group consisting of locally playing a game, locally playing an audio recording, locally playing a video, and locally playing an animation.

* * * * *